United States Patent
Hsu et al.

(10) Patent No.: US 6,740,556 B1
(45) Date of Patent: May 25, 2004

(54) METHOD FOR FORMING EPROM WITH LOW LEAKAGE

(75) Inventors: Ching-Hsiang Hsu, Hsin-Chu (TW); Chih-Hsun Chu, Hsin-Chu (TW); Ming-Chou Ho, Hsin-Chu (TW); Shih-Jye Shen, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/249,075

(22) Filed: Mar. 14, 2003

(51) Int. Cl.[7] .......................................... H01L 21/8247
(52) U.S. Cl. ........................ 438/266; 438/279; 438/291
(58) Field of Search ................................. 438/258, 266, 438/267, 279, 286, 291

(56) References Cited

U.S. PATENT DOCUMENTS

| | | | | |
|---|---|---|---|---|
| 4,435,790 A | * | 3/1984 | Tickle et al. | 257/315 |
| 6,037,247 A | * | 3/2000 | Anand | 438/279 |
| 6,486,525 B1 | * | 11/2002 | Aton | 438/279 |
| 6,573,138 B1 | * | 6/2003 | Pass et al. | 438/291 |

* cited by examiner

*Primary Examiner*—Chandra Chaudhari
(74) *Attorney, Agent, or Firm*—Winston Hsu

(57) ABSTRACT

A method for forming an electrically programmable read-only memory(EPROM) includes forming a first $p^+$ doped region, a second $p^+$ doped region, and a third $p^+$ doped region on an N-well, forming a control gate between the first $p^+$ doped region and the second $p^+$ doped region, and forming a $p^+$ floating gate between the second $p^+$ doped region and the third $p^+$ doped region.

12 Claims, 10 Drawing Sheets

METHOD FOR FORMING EPROM WITH LOW LEAKAGE

BACKGROUND OF INVENTION

1. Field of the Invention

The present invention relates to a method of forming an electrically programmable read-only memory, and more specifically, to an electrically programmable read-only memory with a low leakage current.

2. Description of Background

Electronic memory comes in a variety of forms to serve a variety of purposes. A non-volatile memory is used for easy and fast information storage in such devices as personal digital assistants (PDA), digital cameras, cellular phones, and home video game consoles. It is often desirable to combine many functions on a single device, also called a system-on-a-chip (SOC), to reduce the number and cost of chips. Embedding flash memory allows a single chip produced by a manufacturer to be configured for a variety of applications, and/or allows a single device to be configured by a user for different applications.

A non-volatile memory consists of a plurality of identical non-volatile memory cells. For simplicity, a single non-volatile memory cell is illustrated. Please refer to FIG. 1, which shows a cross-sectional view of a conventional non-volatile memory cell 10. The non-volatile memory cell 10 includes a first PMOS transistor 12 and a second PMOS transistor 14, both transistors formed on an N-well 16, the second PMOS transistor 14 and the first PMOS transistor 12 having a second p+ doped region 20 in common. The first PMOS transistor 12 includes a drain (i.e. a first p+ doped region 18), a control gate 24 formed between the first p+ doped region 18 and the second p+ doped region 20, a source (i.e. the second p+ doped region 20), and an oxide layer 34 formed between the control gate 24 and the N-well 16. The second PMOS transistor 14 includes a drain (i.e. the second p+ doped region 20), a source (i.e. a third p+ doped region 22), a floating gate 26 that is an n-type single-polysilicon, and an oxide layer 32 formed between the floating gate 26 and the N-well 16.

Please refer to FIG. 2A and FIG. 2B. FIG. 2A is a band diagram of the conventional non-volatile memory cell 10 before erasing data with ultraviolet (UV) light, and FIG. 2B is a band diagram of the conventional non-volatile memory cell 10 after erasing data with ultraviolet (UV) light, where Ec represents a conduction band, Ev represents a valence band, Ef represents Fermi level, and arrow 1 represents a direction associated with an electric field. As shown in FIG. 2A, during equilibrium, a vacuum level of a semiconductor must be under a continuous state, and the Fermi level must be under the identical level. While intending to erase data within the non-volatile memory cell 10, the entire non-volatile memory cell 10 is exposed to the UV light. Theoretically, the free electrons initially stored within the floating gate 26 excited by the UV light will pass through oxide layer 32. However, as it is, due to $E=-(dV/dx)$ with E being the electric field, V the electric potential, and x the direction, that is, the electric field is a negative gradient of electric potential. When electrons initially stored within the floating gate 26 leave, an electric field (arrow 1), resulting from an electric potential Vbi, induces the electrons within the N-well 16 passing through the oxide layer 32 and flowing into the floating gate 26 more easily, generating a leakage current. The induced leakage current and the static power dissipation are thus increased. Besides, the residual electrons and ions can further diffuse into the source 22 or drain 20 and accumulate on the interface between the source 22 or drain 20 and the N-well 16 so as to result in a decreased junction breakdown voltage, leading to the malfunction of the device.

SUMMARY OF INVENTION

Accordingly, the purpose of the claimed invention is providing an electrically programmable read-only memory (EPROM) having a new structure of a non-volatile memory cell for reducing a leakage current of a metal-oxide semiconductor (MOS) transistor to solve above-mentioned problem.

The method of the claimed invention includes forming a first p+ doped region, a second p+ doped region, and a third p+ doped region on an N-well, forming a control gate between the first p+ doped region and the second p+ doped region, and forming a p-type floating gate between the second p+ doped region and the third p+ doped region.

The method of the claimed invention also includes forming a first p+ doped region, a second p+ doped region and a third p+ doped region on an N-well, forming a control gate between the first p+ doped region and the second p+ doped region, forming an n-type floating gate between the second p+ doped region and the third p+ doped region, and increasing donor ions implanted within the N-well between the second p+ doped region and the third p+ doped region.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
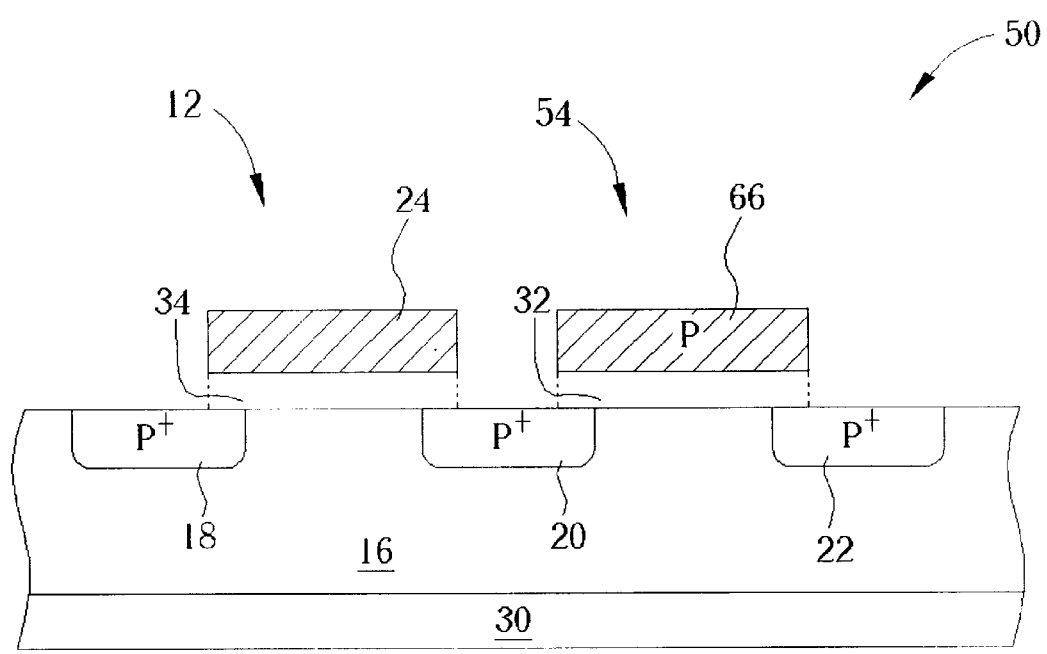
FIG. 3 is a cross-sectional view of the first embodiment of a non-volatile according to the present invention.

Please refer to FIG. 3, which shows a cross section view of a first embodiment of a non-volatile memory cell 50 according to the present invention. The only difference between the non-volatile memory cell 50 and the conventional non-volatile memory cell 10 is the difference with respect to the floating gate 26. The non-volatile memory cell 50 has a first PMOS transistor 12 and a second PMOS transistor 54. Steps for generating the non-volatile memory cell 50 are as follows:

(a) forming an N-well 16 on a p-type substrate 30;

(b) forming a first $p^+$ doped region 18, a second $p^+$ doped region 20, and a third $p^+$ doped region 22 on the N-well 16;

(c) forming an oxide layer 32 and an oxide layer 34 on the N-well 16;

(d) forming a control gate 24 between the first $p^+$ doped region 18 and the second $p^+$ doped region 20 and also above the oxide layer 34 used to isolate the N-well 16 and the control gate 24; and (e) forming a p-type floating gate 66 between the second $p^+$ doped region 20 and the third $p^+$ doped region 22 and also above the oxide layer 32 oxide layer 32 used to isolate the p-type floating gate 66 and the N-well 16.

Note that the floating gate 66 of the second PMOS transistor 54 is a p-type single layer polysilicon, rather than an n-type single layer polysilicon.

Figure 1:
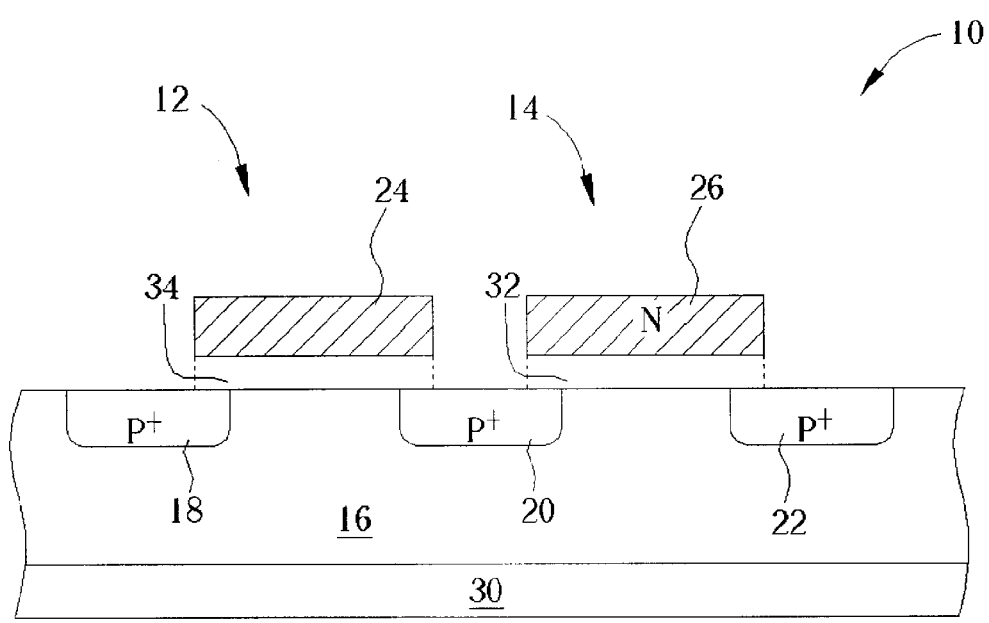
FIG. 1 is a cross-sectional view of a conventional non-volatile memory cell.
Figure 2A:
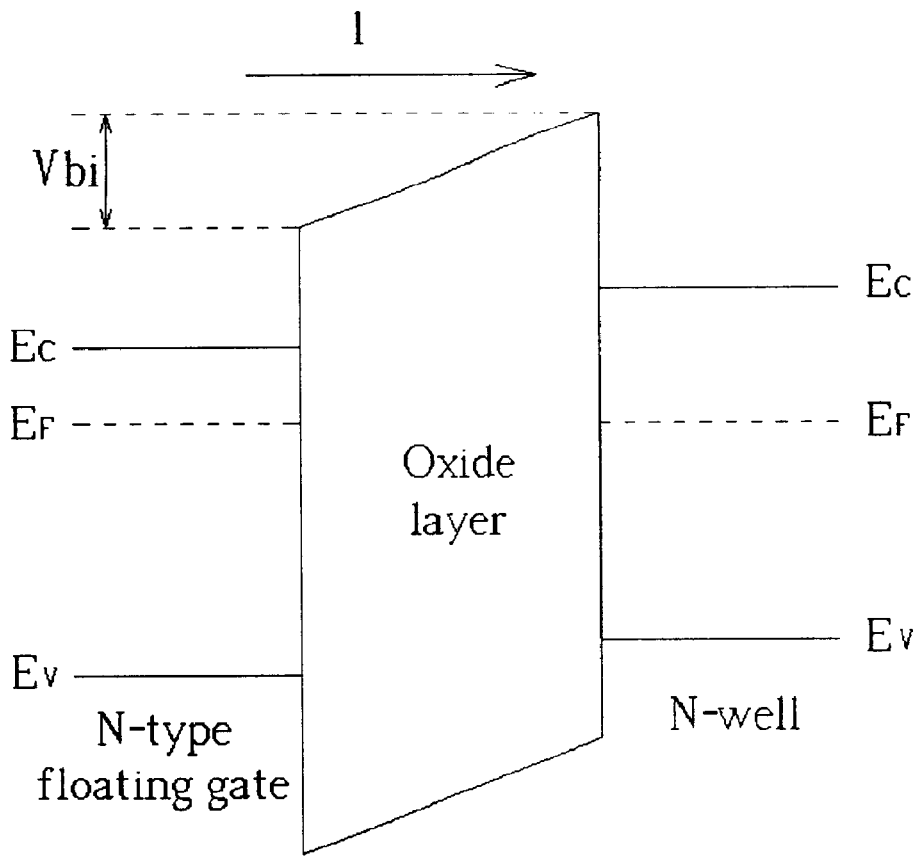
FIGS. 2A and 2B are band diagrams of the conventional non-volatile memory cell before/after erasing data with ultraviolet (UV) light.
Figure 2B:
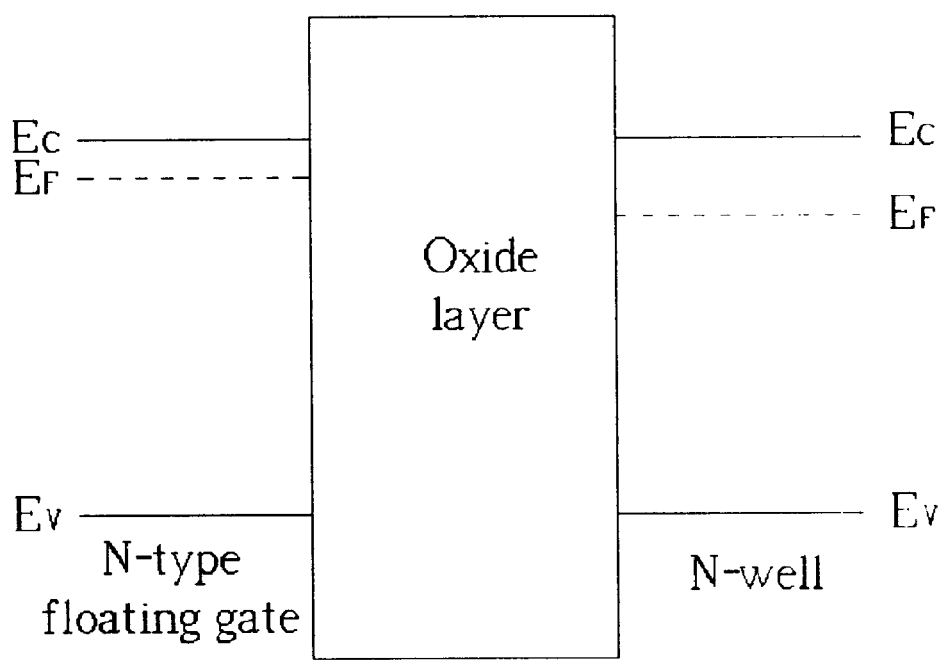
Figure 4:
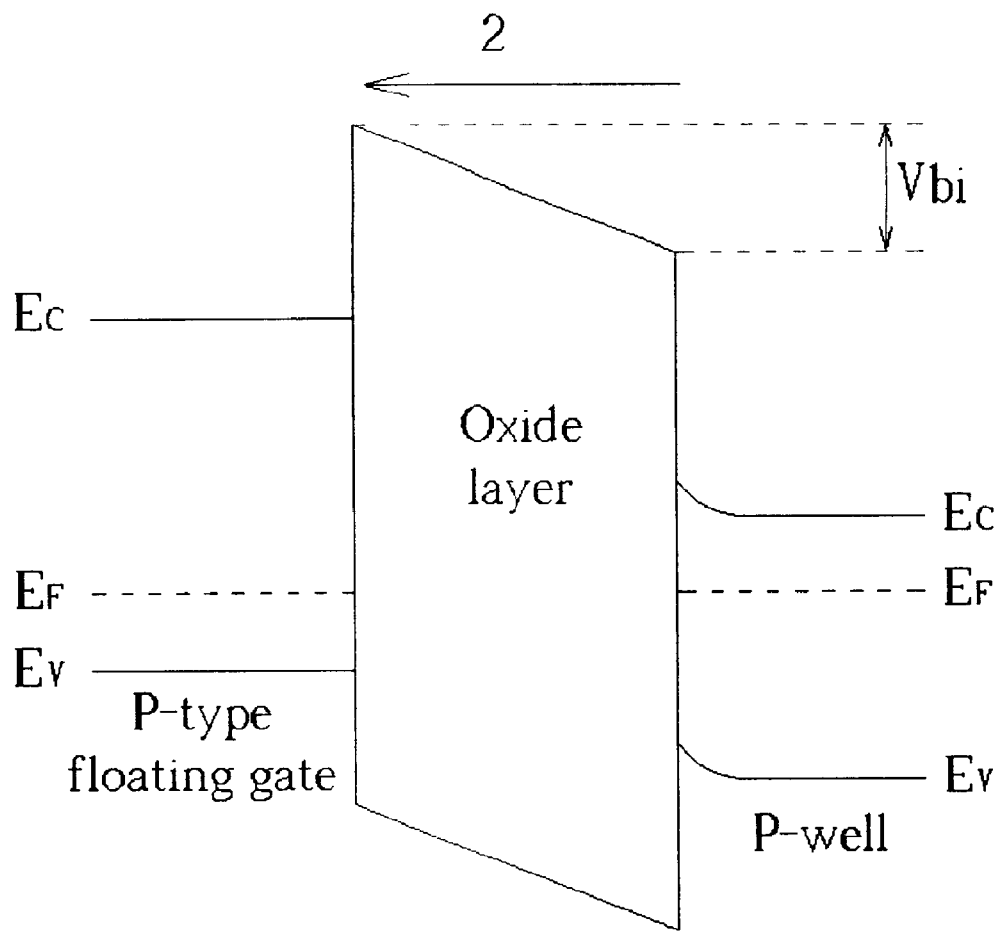
FIG. 4 is a band diagram of the non-volatile memory cell illustrated in FIG. 3 after erasing data with UV light.

Please refer to FIG. 4 in conjunction with FIG. 2A. FIG. 4 is a band diagram of the non-volatile memory cell 50 after erasing data with UV light, where Ec represents a conduction band, Ev represents a valence band, Ef represents Fermi level, arrow 2 represents a direction associated with an electric field, and Vbi represents a built-in voltage. Data stored within the floating gate 66 is erased by exposure to UV light. After being exposed to the UV light, electrons within the floating gate 66 are excited and thus pass through the oxide layer 32. However, from FIG. 4, because of a p-type single layer polysilicon substituting for an n-type single layer polysilicon, a polarity of built-in voltage Vbi across the N-well 16 and the p-type single layer polysilicon for the floating gate 66 is opposite of that across the N-well 16 and the n-type single layer polysilicon. With previous description, due to E=−(dV/dx), with E being the electric field, V the electric potential, and x the direction, the direction of the electric field within the floating gate 66 (the direction of the arrow 2) is exactly opposite of that within the floating gate 26 (the direction of the arrow 2), leading to restraining the electrons within the N-well 16 from flowing to the floating gate 66. Hence, a leakage current is reduced.

Figure 5:
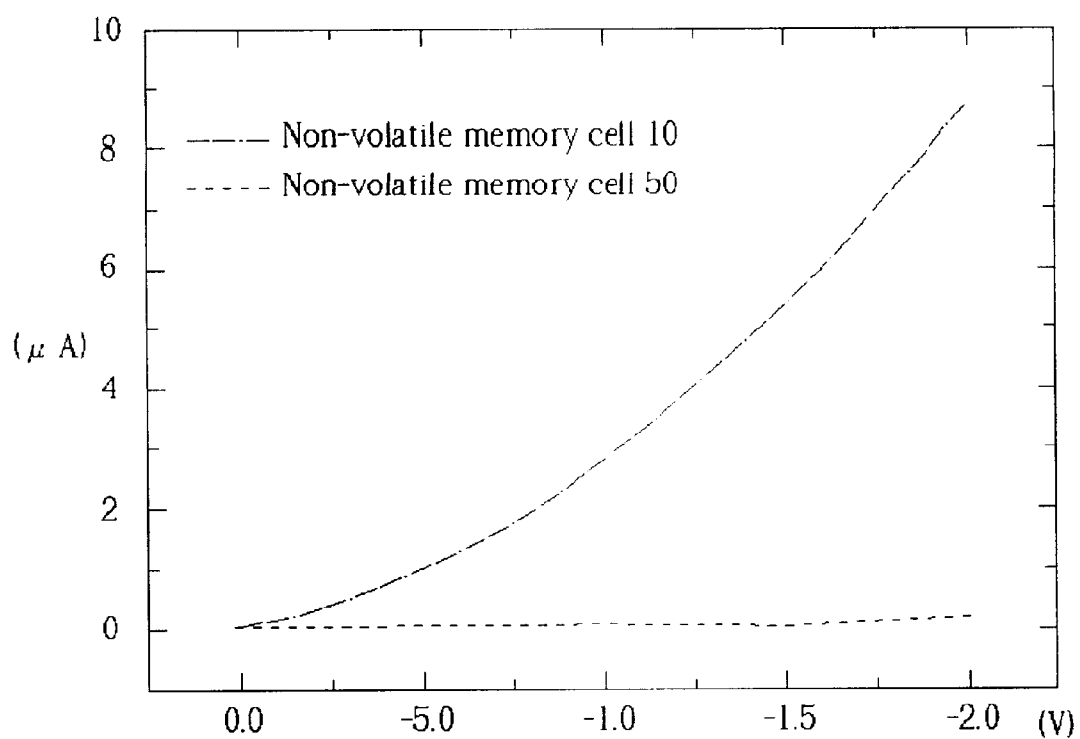
FIG. 5 is a comparison diagram of the non-volatile memory cell illustrated in FIG. 3 and the conventional non-volatile memory cell illustrated in FIG. 1 comparing voltage (V) versus leakage current ($\mu A$).

Please refer to FIG. 5, which shows a comparison diagram of the non-volatile memory cell 50 and the non-volatile memory cell 10 comparing voltage (V) versus current($\mu$A). As shown in FIG. 5, obviously, the leakage current within the floating gate 66 using the p-type single layer polysilicon is smaller than that within the floating gate 26 using the n-type single layer polysilicon.

Figure 6:
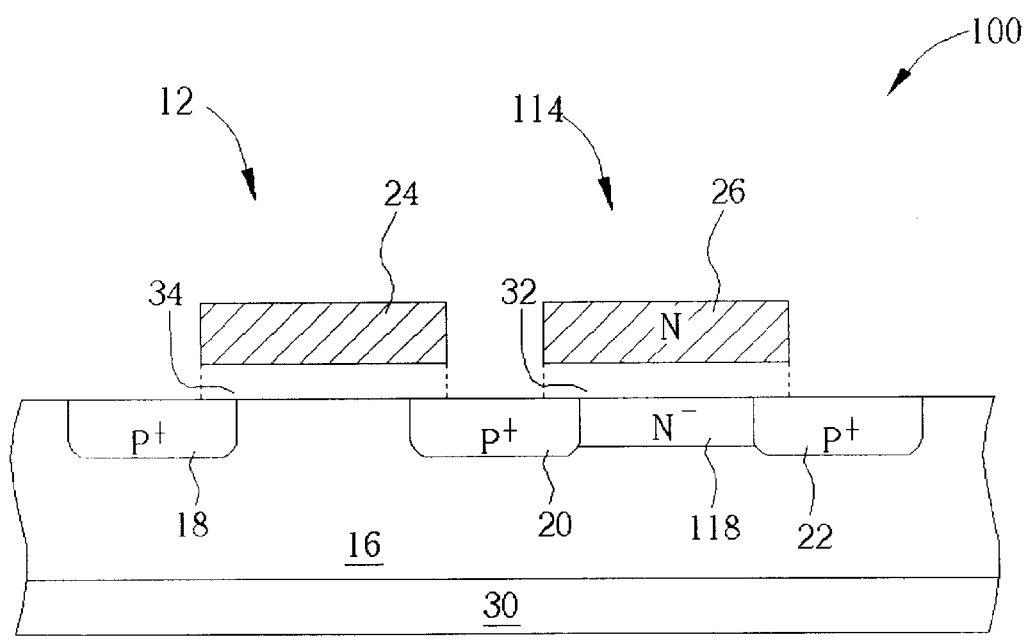
FIG. 6 is a cross-sectional view of the second embodiment of a non-volatile memory cell according to the present invention.

Please refer to FIG. 6, which shows a cross section view of a second embodiment of a non-volatile memory cell 100 according to the present invention. The only difference between the non-volatile memory cell 100 and the conventional non-volatile memory cell 10 is the difference with respect to the N-well 16. The non-volatile memory cell 100 has a first PMOS transistor 12 and a second PMOS transistor 104. Steps for generating the non-volatile memory cell 100 are as follows:

(a) forming an N-well 16 on a p-type substrate 30;

(b) forming a first $p^+$ doped region 18, a second $p^+$ doped region 20, and a third $p^+$ doped region 22 on the N-well 16;

(c) increasing donor ion density within the N-well 16 between the second $p^+$ doped region 20 and the third $p^+$ doped region 22 by repeatedly doping so as to form an $n^-$ doped region 118;

(d) forming an oxide layer 32 between the second $p^+$ doped region 20 and the third $p^+$ doped region 22 above the n-doped region 118, and forming an oxide layer 34 between the first $p^+$ doped region 18 and the second $p^+$ doped region 20 on the N-well 16;

(e) forming control gate 24 on an oxide layer 34 used to isolate the N-well 16 and the control gate 24; and (f) forming a floating gate 26 on an oxide layer 32 used to isolate the floating gate 26 and the N-well 16.

Figure 7A:
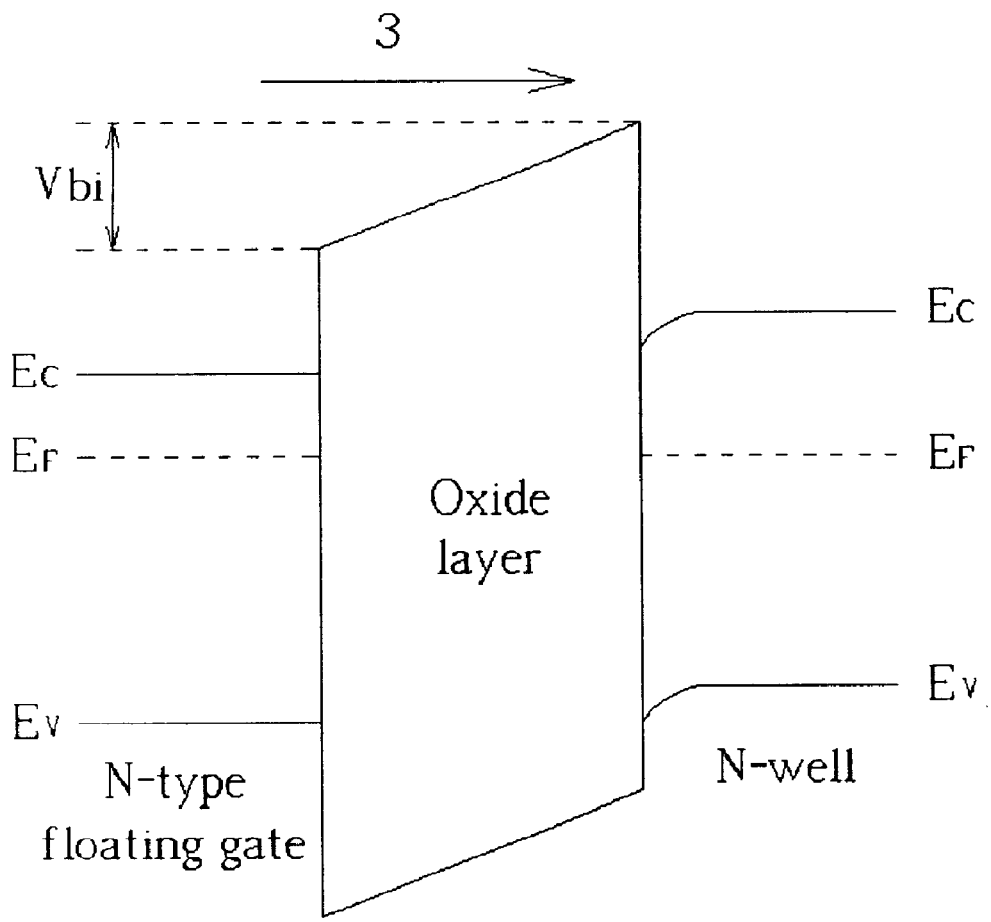
FIGS. 7A and 7B are band diagrams of the non-volatile memory cell illustrated in FIG. 1, and the non-volatile memory cell with an n− doped region illustrated in FIG. 6 after erasing data with UV light, respectively.
Figure 7B:
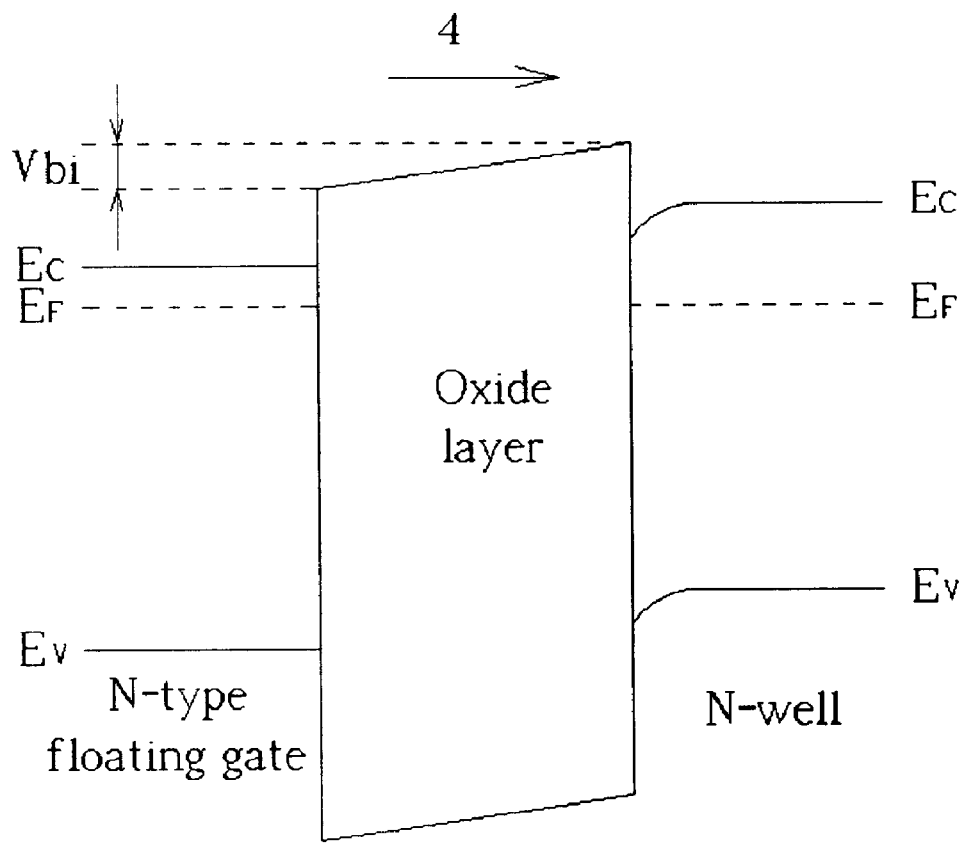

Please refer to FIG. 7A and FIG. 7B in conjunction with FIG. 6. FIG. 7A is a band diagram of the non-volatile memory cell 10 with a normal implant N-well 16 after erasing data with UV light, and FIG. 7B is a band diagram of a non-volatile memory cell 100 with an $n^-$ doped region 118 after erasing data with UV light, where Ec represents a conduction band, Ev represents a valence band, Ef represents Fermi level, arrows 3,4 represent directions associated with an electric field, and Vbi represents a built-in voltage. Data stored within the floating gate 26 is erased by exposing UV light. From FIG. 7B, since the $n^-$ doped region 118 close to the oxide layer 32 has higher donor ions implanted in comparison with a normal N-well 16, a lower built-in voltage results. Due to E=−(dV/dx) with E being the electric field, V the electric potential, and x the direction, the electric field between the floating gate 26 and the $n^-$ doped region 118 in the memory cell 100 (arrow 4 illustrated in FIG. 7B) is weaker than that between the floating gate 26 and the N-well 16 in the memory cell 10 (arrow 3 illustrated in FIG. 7A), leading to restraining the electrons within the N-well 16 from flowing to the floating gate 26. Hence, a leakage current is reduced.

Figure 8:
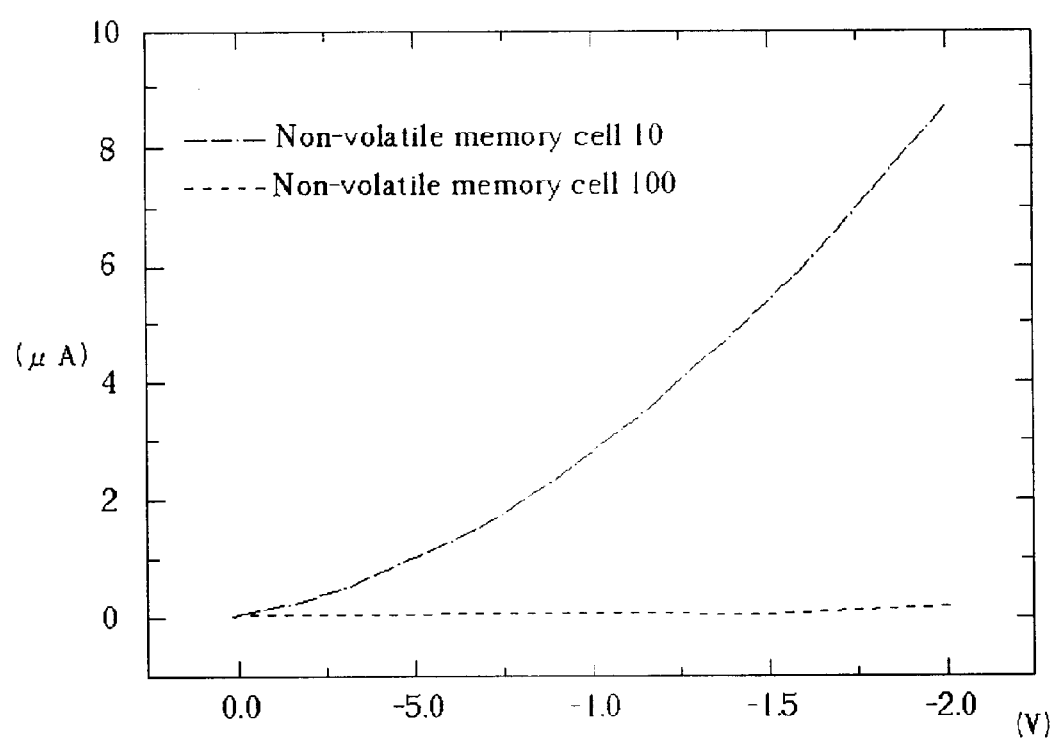
FIG. 8 is a comparison diagram of the non-volatile memory cell illustrated in FIG. 6 and the conventional non-volatile memory cell illustrated in FIG. 1 comparing voltage (V) versus leakage current ($\mu A$).

Please refer to FIG. 8, which shows a comparison diagram of the non-volatile memory cell 100 and the non-volatile memory cell 10 comparing voltage (V) versus current($\mu$A). As shown in FIG. 8, obviously, the leakage current within N-well 16 with high implant $n^-$ doped region 118 is smaller than that within the conventional N-well 16.

The EPROM is composed by a plurality of non-volatile memory cells 50 or 100. The EPROM is a one time programmable (OTP).

In contrast to prior art, the floating gate using a p-type single layer polysilicon instead of an n-type single layer polysilicon is capable of reversing the direction of the electric field within the oxide layer and restraining electrons within the N-well from flowing to the floating gate. The high implant n-doped region between the source and the drain, and close to the floating gate is also capable of reducing the built-in voltage and thus decreasing the electric field between the N-well and the floating gate and restraining electrons within the N-well from flowing to the floating gate. By means of above two methods, a leakage current generated after using UV light for erasing data stored within the floating gate is reduced.

Those skilled in the art will readily observe that numerous modifications and alterations of the method may be made while retaining the teachings of the invention. Accordingly, the above disclosure should be construed as limited only by the metes and bounds of the appended claims.

What is claimed is:

1. A method of forming an electrically programmable read-only memory (EPROM) comprising:

forming a first $p^+$ doped region, a second $p^+$ doped region, and a third $p^+$ doped region on an N-well;

forming a control gate between the first $p^+$ doped region and the second $p^+$ doped region; and forming a p-type floating gate between the second p⁺ doped region and the third p⁺ doped region.

2. The method of claim 1 wherein the EPROM is one time programmable (OTP).

3. The method of claim 1 wherein the EPROM further comprises a p-type substrate, and the N-well is formed on the p-type substrate.

4. The method of claim 1 further comprising:

forming a first oxide layer between the N-well and the control gate for isolating the N-well and the control gate; and forming a second oxide layer between the N-well and the floating gate for isolating the N-well and the floating gate.

5. The method of claim 1 wherein the floating gate is a conducting polysilicon.

6. The method of claim 1 further comprising:

erasing data stored within the floating gate by exposure to ultraviolet (UV) light.

7. A method of forming an electrically programmable read-only memory (EPROM) comprising:

forming a first p⁺ doped region, a second p⁺ doped region, and a third p⁺ doped region on an N-well;

forming a control gate between the first p⁺ doped region and the second p⁺ doped region;

forming an n-type floating gate between the second p⁺ doped region and the third p⁺ doped region; and increasing donor ions implanted within the N-well between the second p⁺ doped region and the third p⁺ doped region so as to form an n⁻ doped region.

8. The method of claim 7 wherein the EPROM is one time programmable (OTP).

9. The method of claim 7 wherein the EPROM further comprises a p-type substrate, and the N-well is formed on the p-type substrate.

10. The method of claim 7 further comprising:

forming a first oxide layer between the N⁻ doped region and the control gate for isolating the N⁻ doped region and the control gate; and forming a second oxide layer between the N-well and the p-type floating gate for isolating the N-well and the floating gate.

11. The method of claim 7 wherein the floating gate is a conducting polysilicon.

12. The method of claim 7 further comprising:

erasing data stored within the floating gate by exposure to ultraviolet (UV) light.

* * * * *